United States Patent
Eppich et al.

(10) Patent No.: US 10,270,220 B1
(45) Date of Patent: Apr. 23, 2019

(54) METHODS AND SYSTEMS FOR HEAT FLUX HEAT REMOVAL

(71) Applicants: Henry M. Eppich, Andover, MA (US); Jonah H. Jacob, Brookline, MA (US)

(72) Inventors: Henry M. Eppich, Andover, MA (US); Jonah H. Jacob, Brookline, MA (US)

(73) Assignee: SCIENCE RESEARCH LABORATORY, INC., Somerville, MA (US)

( * ) Notice: Subject to any disclaimer, the term of this patent is extended or adjusted under 35 U.S.C. 154(b) by 360 days.

(21) Appl. No.: 14/206,607

(22) Filed: Mar. 12, 2014

Related U.S. Application Data

(60) Provisional application No. 61/779,499, filed on Mar. 13, 2013.

(51) Int. Cl.
*H01S 5/024* (2006.01)

(52) U.S. Cl.
CPC .................. *H01S 5/02469* (2013.01)

(58) Field of Classification Search
CPC ............ H01S 5/02423; H01L 23/4336; H01L 23/4735
USPC ............................ 372/35; 361/699; 165/80.4
See application file for complete search history.

(56) References Cited

U.S. PATENT DOCUMENTS

| | | | |
|---|---|---|---|
| 3,455,376 A | | 7/1969 | Beurtheret |
| 5,056,127 A | * | 10/1991 | Iversen et al. ................. 378/130 |
| 5,105,430 A | * | 4/1992 | Mundinger et al. ............ 372/35 |
| 5,177,667 A | * | 1/1993 | Graham et al. ............... 361/715 |
| 5,265,670 A | * | 11/1993 | Zingher ........................ 165/80.4 |
| 5,349,831 A | * | 9/1994 | Daikoku et al. ................ 62/376 |
| 5,453,641 A | * | 9/1995 | Mundinger ............... F28D 9/00 165/104.21 |
| 5,548,605 A | * | 8/1996 | Benett et al. .................... 372/36 |
| 5,828,683 A | * | 10/1998 | Freitas ............................. 372/36 |
| 5,864,466 A | * | 1/1999 | Remsburg ..................... 361/700 |
| 5,959,351 A | * | 9/1999 | Sasaki et al. ................. 257/714 |
| 6,064,572 A | * | 5/2000 | Remsburg ..................... 361/700 |
| 6,301,109 B1 | | 10/2001 | Chu et al. |
| 6,431,260 B1 | * | 8/2002 | Agonafer et al. ........... 165/80.4 |
| 6,519,151 B2 | * | 2/2003 | Chu et al. ..................... 361/699 |
| 7,017,654 B2 | * | 3/2006 | Kenny et al. ................ 165/80.4 |
| 7,201,217 B2 | * | 4/2007 | Johnson et al. ............. 165/170 |
| 7,277,283 B2 | * | 10/2007 | Campbell et al. ........... 361/699 |
| 7,898,807 B2 | * | 3/2011 | Beaupre ............. H01L 23/3735 165/80.4 |
| 8,659,896 B2 | * | 2/2014 | Dede et al. ................... 361/699 |
| 9,980,415 B2 | * | 5/2018 | Zhou .................. H05K 7/20927 |
| 2002/0062945 A1 | * | 5/2002 | Hocker et al. .................. 165/53 |

(Continued)

FOREIGN PATENT DOCUMENTS

| | | | | |
|---|---|---|---|---|
| DE | 4335512 A1 | * | 6/1995 | ............. H01S 3/043 |
| RU | 2169977 C2 | * | 6/2001 | ............. H02S 5/24 |
| WO | WO 2010115415 A2 | * | 10/2010 | ............. H01S 5/024 |

OTHER PUBLICATIONS

U.S. Appl. No. 13/573,551, filed Sep. 2012, Jacob et al.*

(Continued)

*Primary Examiner* — Joshua King
(74) *Attorney, Agent, or Firm* — Burns & Levinson LLP; Orlando Lopez

(57) ABSTRACT

Methods and systems for increased heat removal from devices in which the component design allows for thinner heat removal components.

18 Claims, 18 Drawing Sheets

(56) References Cited

U.S. PATENT DOCUMENTS

| | | | |
|---|---|---|---|
| 2004/0112571 A1* | 6/2004 | Kenny | F04B 17/00 |
| | | | 165/80.3 |
| 2005/0094373 A1* | 5/2005 | Weber et al. | 361/699 |
| 2006/0108098 A1* | 5/2006 | Stevanovic | H01L 23/473 |
| | | | 165/80.4 |
| 2006/0162365 A1* | 7/2006 | Hoang et al. | B08B 7/0035 |
| | | | 62/259.2 |
| 2006/0250773 A1* | 11/2006 | Campbell et al. | 361/699 |
| 2009/0314467 A1* | 12/2009 | Campbell et al. | 165/80.4 |
| 2010/0296247 A1* | 11/2010 | Chang et al. | 361/699 |

OTHER PUBLICATIONS

Prandtl, Essentials of Fluid Dynamics, authorized translation, Hafner publishing company, New York, New York 1952.
Batchelor, An Introduction to Fluid Dynamics., Cambridge University press, 1967.
Streeter, Fluid Mechanics, McGraw-Hill book Company, 1962.
Eppich et al., Thin format, scalable, high performance microchannel coolers for high power laser diodes, 2014 Solid State Diode Laser Technology Review, Directed Energy Professional Society.

\* cited by examiner

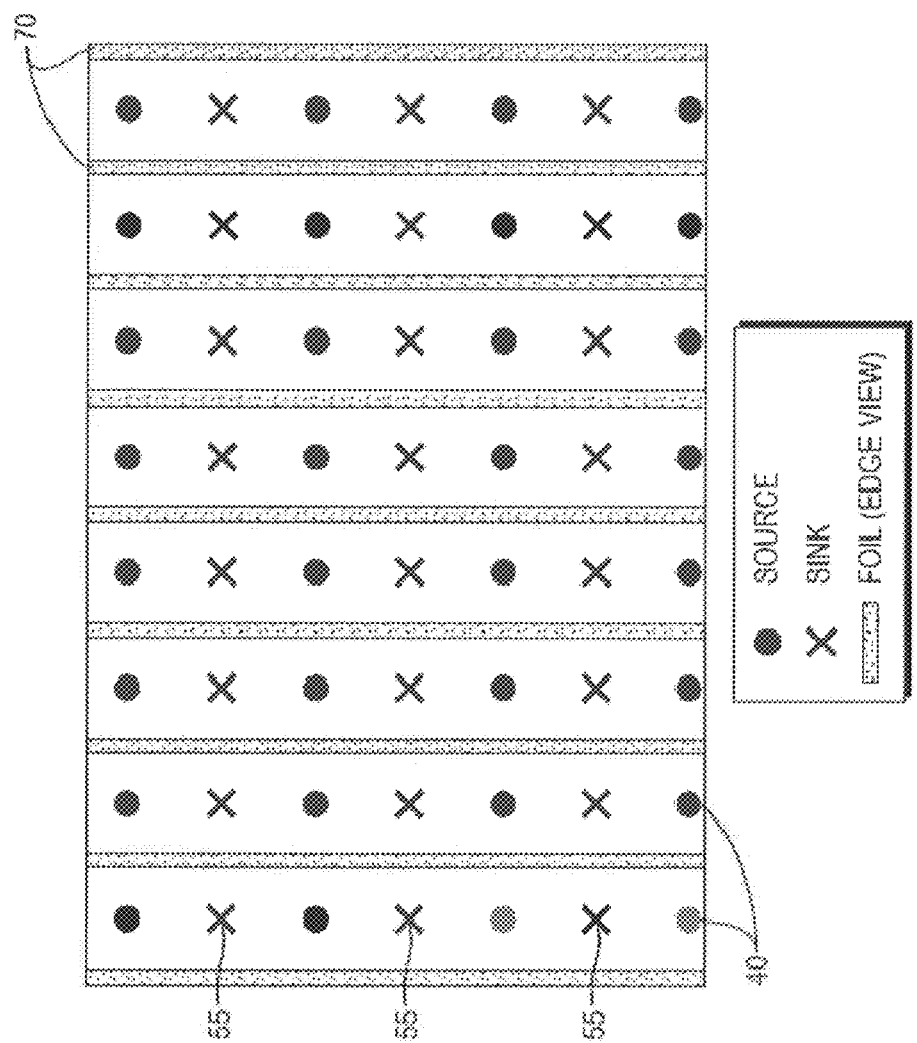

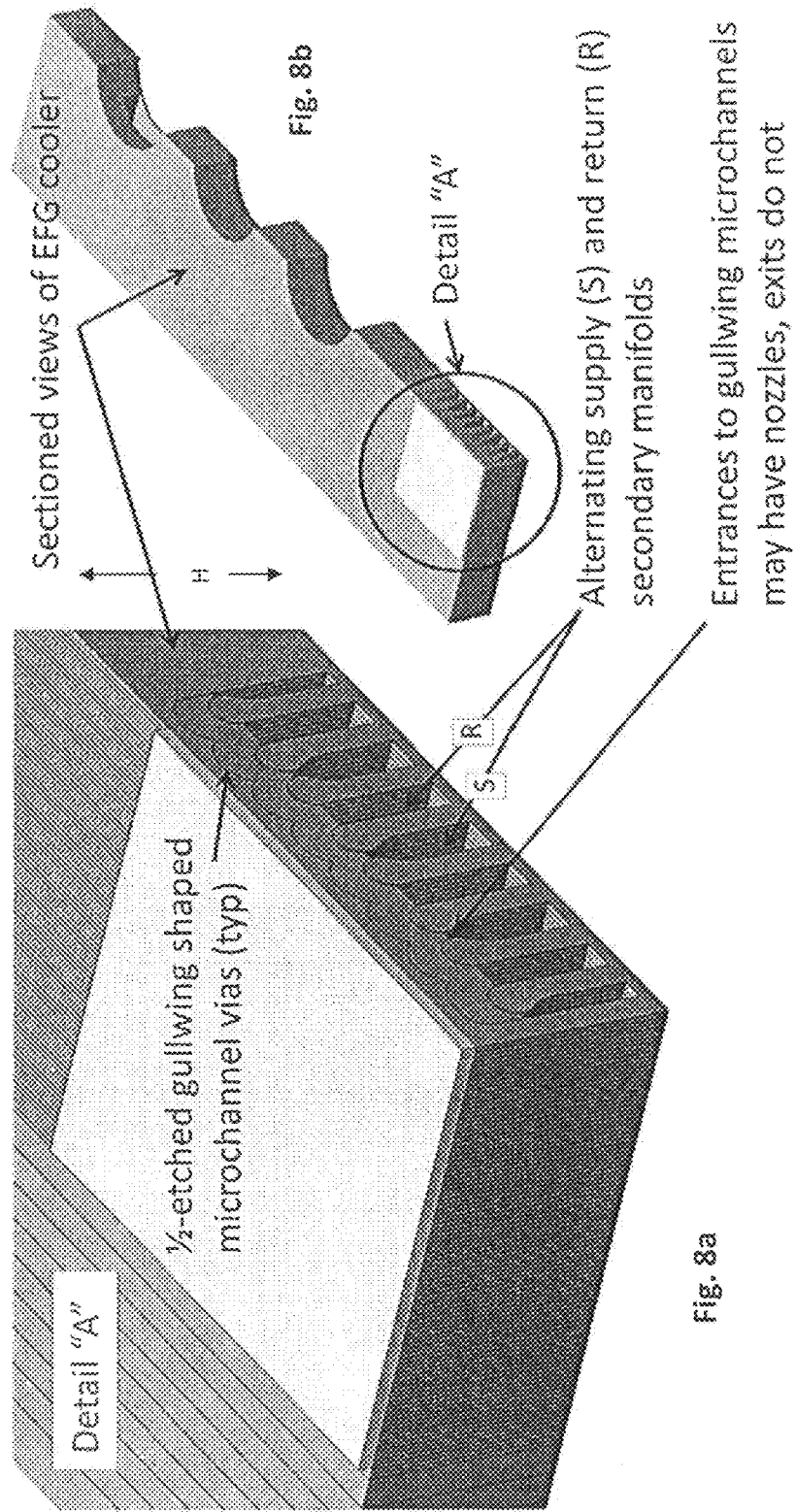

Primary return manifold with dimensions: $W_{PR} \times H_{PR} \times L_{PR}$
Primary supply manifold with dimensions: $W_{PS} \times H_{PS} \times L_{PS}$

METHODS AND SYSTEMS FOR HEAT FLUX HEAT REMOVAL

CROSS REFERENCE TO RELATED APPLICATIONS

This application claims priority to U.S. Provisional Application Ser. No. 61/779,499, METHODS AND SYSTEMS FOR HEAT FLUX HEAT REMOVAL, filed Mar. 13, 2013, which is incorporated herein by reference in its entirety for all purposes.

BACKGROUND

This invention relates generally to impingement coolers, and, more particularly, to impingement coolers capable of low thermal resistance and large heat flux heat removal.

A variety of devices of interest require removal of a large heat fluxes. For example, although other examples are also possible, high-power laser diodes could require heat removal at a heat flux greater than 0.5 kW/cm2 with low thermal resistance. In addition, having a spatially varying resistance would be very beneficial. Conventional heat removal technologies limit laser diode scaling to about 200 w/bar-cm.

While the above detailed example presents the need for improved methods for cooling (heat removal) in laser diodes, other solid-state devices (such as, but not limited to, microwave/millimeter wave monolithic integrated circuits-MIMICs, computer CPUs, concentrator photovoltaic cells, etc.) produce a large waste heat output that also has to be removed.

Several approaches have been used for removing the heat from solid-state devices. In one approach, confined-flow heat exchangers are built into or located adjacent to the heat-producing surfaces of the solid-state device. While such confined-flow heat exchangers are operable, they cannot remove heat at the high rates required for high-power devices that produce very large heat fluxes. They are also limited in their ability to compensate devices that generate waste heat that is spatially dependent.

Jet impingement coolers have also been used. In this approach, one or more jets of a coolant, typically a liquid, are directed at the surface to be cooled. This approach is also operable but has shortcomings. The existing designs have a limited ability to remove large amounts of heat, unless the flow rate of coolant is so high as to be impractical for many situations. Additionally, there are temperature gradients across the surface being cooled, resulting in undesirable transverse thermally induced strain in the solid-state device or non-optimum performance of the solid-state device. Jet impingement coolers that operate at low pressure are also much thicker than is practical for laser diode arrays and stacks. In addition, none of these devices have a thermal resistance that can compensate for spatially varying waste heat generation.

There is a need to provide improved methods of heat removal for devices requiring removal of a large amounts of heat, while simultaneously providing a low thermal resistance, a low heat source temperature and with dimensions that are narrow such that it can accommodate compact geometries.

In order to produce high brightness laser diode systems, laser diodes in conjunction with their heat removal component (cooler) can be stacked. The thickness of present heat does not allow for high brightness laser diode systems configured by stacking laser diode subsystems. There is a need for a heat removal component design that allows for thinner heat removal components.

BRIEF SUMMARY

Methods and systems for increased heat removal from devices, where the component design allows for thinner heat removal components, are disclosed herein below.

In one or more embodiments, the system of these teachings includes a cooler assembly having a first surface, a second surface disposed away from the first surface, a number of openings extending from the first surface to the second surface, one opening from the number of openings being a coolant outlet port, another opening from the number of openings being a coolant inlet port, a region proximate to a first end comprising a heat extraction component, the region disposed to receive an electronic component on the first surface, a first and second sides extending from the first end to a second end, a supply manifold operatively connecting the coolant inlet port to a number of supply openings in the heat extraction component, a portion of the supply manifold extending along a portion of the first side, a return manifold operatively connecting the coolant outlet port to a number of return openings in the heat extraction component, a depth of the supply manifold and the return manifold extending from the first surface towards the second surface.

In one instance, the heat extraction component in one embodiment of the system of these teachings is a jet impingement cooler including a number of pairs of openings, each pair comprising a supply opening and a return opening, each one supply opening being operatively disposed to provide fluid to an impingement section; each one return opening being operatively disposed to receive fluid from an impingement section, the impingement section having a first surface from which fluid is provided from the supply opening and to which fluid is returned to the return opening, a second surface opposite said first surface, the second surface having a number of curved sections, each one curved section being concave towards an impinging flow direction of the fluid provided from one supply opening from one pair of openings, each one curved section and the one pair of openings being operatively disposed such that there is substantially no stagnation point in flow along said each one curved section, and a third surface opposite said second surface and thermally operatively connected to the second surface, the third surface disposed to receive the electronic component.

Embodiments of laser diode stacks and embodiments of methods applying the system of these teachings in order to obtain higher brightness laser diode arrays are also disclosed Other embodiments of the method and system of these teachings are disclosed hereinbelow.

For a better understanding of the present teachings, reference is made to the accompanying drawings and detailed description and its scope will be pointed out in the appended claims.

BRIEF DESCRIPTION OF THE DRAWINGS

FIG. 2d is a schematic representation of a cross-section of still another embodiment of a jet impingement cooler of these teachings;

FIGS. 8a and 8b show two different cross-sections of the heat flux removal module of these teachings;

DETAILED DESCRIPTION

Figure 1:
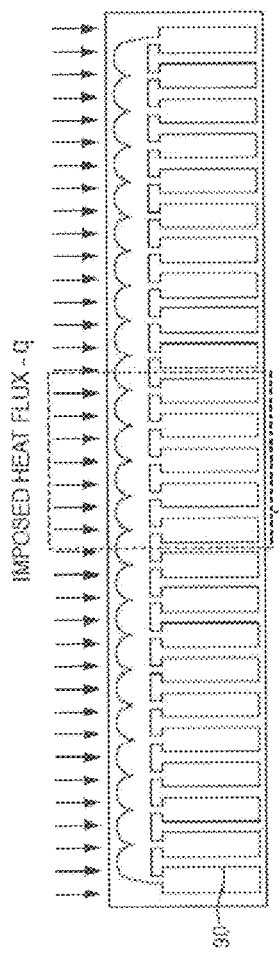
FIG. 1 is a pictorial schematic representation of an embodiment of a jet impingement cooler.

Methods and systems for increased heat removal from devices, where the component design allows for thinner heat removal components, are disclosed hereinbelow. Present and future high-power semiconductor devices place requirements on total waste heat (Q), waste heat flux (q), heat extraction area (A) and areal thermal resistance, (pth) and thermal resistance (Rth) in a compact geometry that are not met by conventional heat removal systems. Those requirements are met by the disclosed systems.

The following detailed description presents the currently contemplated modes of carrying out the invention. The description is not to be taken in a limiting sense, but is made merely for the purpose of illustrating the general principles of the invention.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

In one or more embodiments, the system of these teachings includes a cooler assembly having a first surface, a second surface disposed away from the first surface, a number of openings extending from the first surface to the second surface, one opening from the number of openings being a coolant outlet port, another opening from the number of openings being a coolant inlet port, a region proximate to a first end comprising a heat extraction component, the region disposed to receive an electronic component on the first surface, a first and second sides extending from the first end to a second end, a supply manifold operatively connecting the coolant inlet port to a number of supply openings in the heat extraction component, a portion of the supply manifold extending along a portion of the first side, a return manifold operatively connecting the coolant outlet port to a number of return openings in the heat extraction component, a depth of the supply manifold and the return manifold extending from the first surface towards the second surface. The above embodiments allow for high brightness laser diode systems configured by stacking laser diode subsystems by providing a heat removal component design that allows for thinner heat removal components. In one instance, a distance between the first surface and the second surface is less than 3 mm. One embodiment of the system of these teachings is shown in FIGS. 7a-10.

In one instance, the heat extraction component in one embodiment of the system of these teachings is a jet impingement cooler including a number of pairs of openings, each pair comprising a supply opening and a return opening, each one supply opening being operatively disposed to provide fluid to an impingement section; each one return opening being operatively disposed to receive fluid from an impingement section, the impingement section having a first surface from which fluid is provided from the supply opening and to which fluid is returned to the return opening, a second surface opposite said first surface, the second surface having a number of curved sections, each one curved section being concave towards an impinging flow direction of the fluid provided from one supply opening from one pair of openings, each one curved section and the one pair of openings being operatively disposed such that there is substantially no stagnation point in flow along said each one curved section, and a third surface opposite said second surface and thermally operatively connected to the second surface, the third surface disposed to receive the electronic component. In one embodiment, a radius of curvature of each one curved section is varied along said each one curved section. In one instance, the radius of curvature is decreased along a flow direction.

Figure 2A:
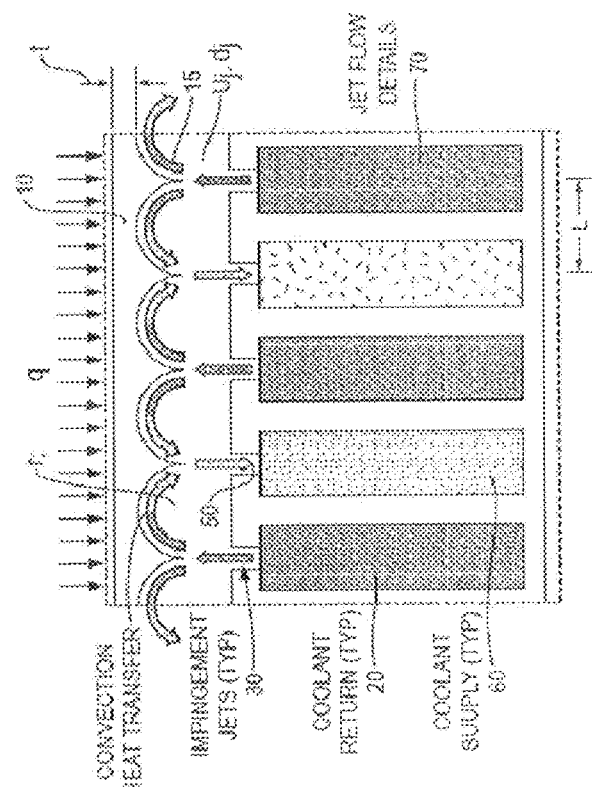
FIG. 2a is a pictorial representation of a section of the embodiment of FIG. 1.
Figure 2B:
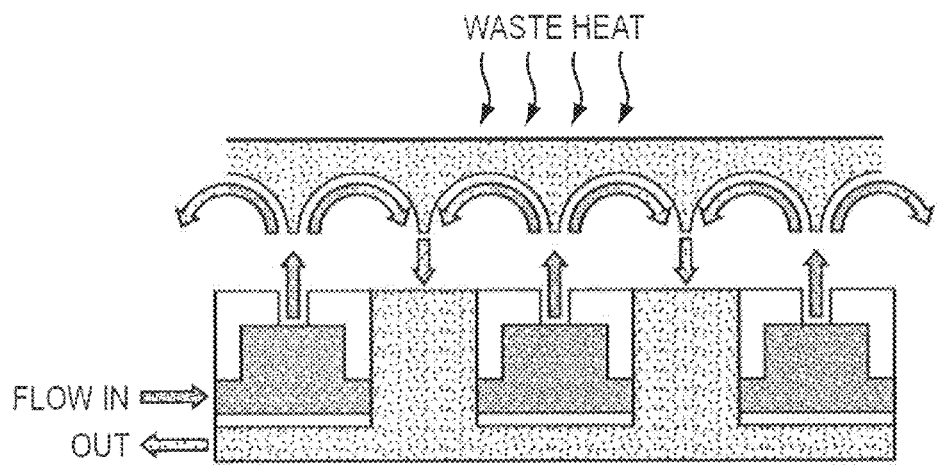
FIG. 2b is a pictorial representation of a section of another embodiment of a jet impingement cooler of these teachings.

FIGS. 1, 2a, 2b illustrate a cut away perspective view of a multi-jet impingement cooler according to an illustrative embodiment of the present teachings. The device to be cooled is placed in contact with the scalloped (gull wing shaped) component 10. Coolant fluid is supplied by appropriate means (not shown) and the flow of coolant fluid is directed to and from the scalloped component 10 by the scalloped (gull winged) surface 15. The scalloped surface 15 is concave toward the impinging flow direction. Although the surface 15 is shown in FIG. 2a as including a number of circular arcs, these teachings are not limited only to that embodiment. Other embodiments in which the surface 15 includes a number of curved sections, each curve section being concave towards the direction of the impinging flow are within the scope of these teachings. It should be noted that the radius of curvature can be varied along the curved section, being different at different locations on the curved. In one instance, these teachings not being limited only to that instance, the radius of curvature is decreased along the flow direction. Although not desiring to be bound by theory, in one explanation, decreasing the radius of curvature of the curved section along the flow direction substantially preserves the centripetal force as the coolant fluid velocity is reduced due to frictional and viscous forces. Also, while not desiring to be bound by theory, in another explanation, decreasing the radius of curvature of the curved section along the flow direction imposes a substantially increasing centripetal force on the coolant fluid which can lead to minimizing boundary layer growth and substantially optimizing convective heat transfer. Coolant fluid is supplied to the coolant supply chamber 20 and exits through one of the number of jet orifices 30 as one of a number of impingement jets 40. The coolant fluid jets impinge upon the scalloped surface 15 and cool the surface by convection heat transfer. The coolant fluid is directed, by the scalloped surface 15, back to one of a number of outlet orifices 50 and returns to a coolant return chamber 60. It should be noted that, in the embodiments shown in FIGS. 1, 2a, 2b and 2c, in view of the curved nature of scalloped surface 15, there is substantially no stagnation point in the flow of the coolant fluid. Coolant fluid is returned by appropriate means, shown in FIGS. 2d-2h, to a coolant supply and, in many embodiments, heat is removed from the coolant upon return.

In one embodiment, the jet orifices 30, the coolant supply chambers 20, the outlet orifices 50 and the coolant return chambers 60 are formed by thin sheets 70, also referred to as foils (or equivalently, by a foil set 70 or a number of foil sets 70). In one embodiment, the thin sheets comprise a thermally conductive material such as, but not limited to, OFHC copper, or a copper-based material such as a copper alloy or dispersion-strengthened copper or other materials such as, but not limited to, stainless steel or a copper-molybdenum alloy. In another embodiment, the thin sheets comprise thermally conducting electrical insulators, such as, but not limited to, diamond and aluminum nitrite. In one instance, the thin sheets have a thickness ranging from about 25 microns to about 250 microns.

In one embodiment, the thin sheets 70 form boundaries confining the jet 40 impingement flow and define the geometric characteristics of the jet orifice 30 and the coolant supply chamber 20. By defining the geometric characteristics of the jet orifice 30 and the coolant supply chamber 20, the speed of the jet impingement flow can be tailored to obtain desired properties. In embodiments of which the thin sheets 70 comprise thermally conductive material, the coolant return chamber 60 and the outlet orifices 50 can play an active role in the heat transfer.

In the embodiment shown in FIG. 1, side walls 90 seal the cooler. It should be noted that these teachings are not limited to only that embodiment. In other embodiments, a sealing component, such as, but not limited to, a seal ring or other sealing component, is utilized. Also in the embodiments shown in FIGS. 1, 2a, 2b, the spacing and geometry of the impinging jets and outlets appears to be uniformly distributed. It should be noted that other embodiments where the spacing and geometry (and the resulting flow properties) are distributed in a predetermined fashion in order to compensate a previously known temperature distribution over the object being cooled (such as, but not limited to, hotspots in a semiconductor or laser diode, or regions of laser diodes with high absorption such as the area in the vicinity of the output facet) are within the scope of these teachings. The spacing and geometry of the impinging jets and corresponding outlet are selected, in one instance, in order to substantially achieve temperature uniformity across the device being cooled or across a region of the device being cooled.

FIG. 2d illustrates that the rows of alternating jets and discharge ports can be viewed as a series of coolant source/sink pairs separated by barriers (bounding foils). The cross-sectional view in FIG. 2d is perpendicular to the plane containing the throats 30 of the impingement jets 40. When viewing the jet impingement cavity normal to the plane containing the throats 30 of the impingement jets 40, the flow between jets 40 and neighboring discharge ports 55 can be conceptually envisioned as rows containing alternating coolant sources and sinks separated by barriers 70 (bounding foils 70, which also act as cooling fins in a heat exchanger). The foil barriers 70, or cooling fins, can confine the jet flow to be two-dimensional along the internal gull wing surface 15. In contrast, if the bounding foils 70 were not present, the jet flow, upon impinging on the internal gull wing surface 15, would spread, for example, in the direction perpendicular to the tangent to the internal gull wing (scalloped) surface 15. In this case, jet velocity can drop rapidly with distance from the point of impingement, which leads to lower convective heat transfer rates, thus higher boundary layer thermal resistance. In addition, as mentioned above, the barriers 70 can act as cooling fins. In some instances, not a limitation of these teachings, these fins could be made of a very high conducting material such as diamond. Confining the impingement flow between foils 70 (barriers) can keep local velocities elevated by preventing two-dimensional spreading, which leads to lower boundary layer thermal resistance. Confining the impingement flow between foils 70 (barriers) can also prevent interactions with neighboring jets that would lead to undesirable flow patterns due to pressure gradients imposed by pressure drops in supply and return manifolding.

Figure 2C:
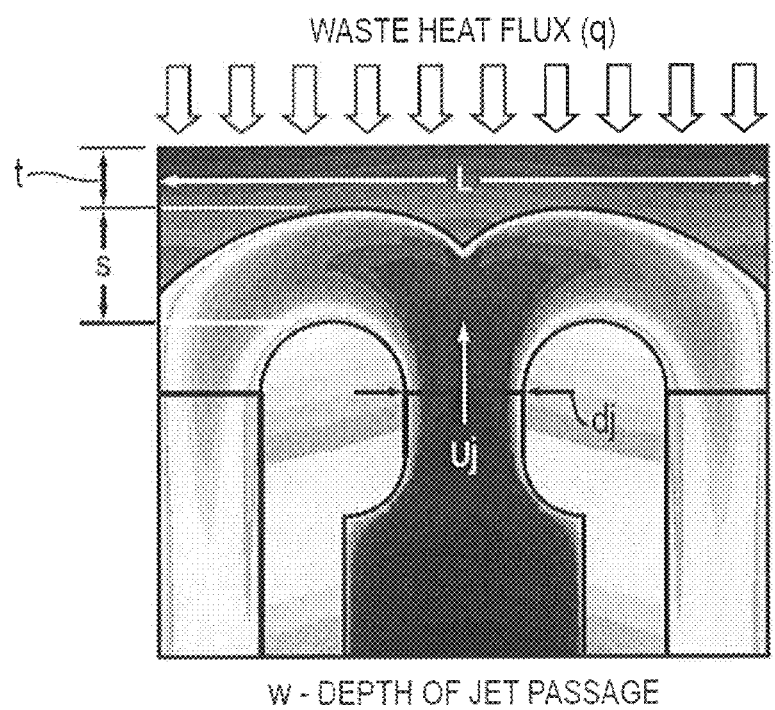
FIG. 2c is a pictorial representation of a section of yet another embodiment of a jet impingement cooler of these teachings.
Figure 2E:
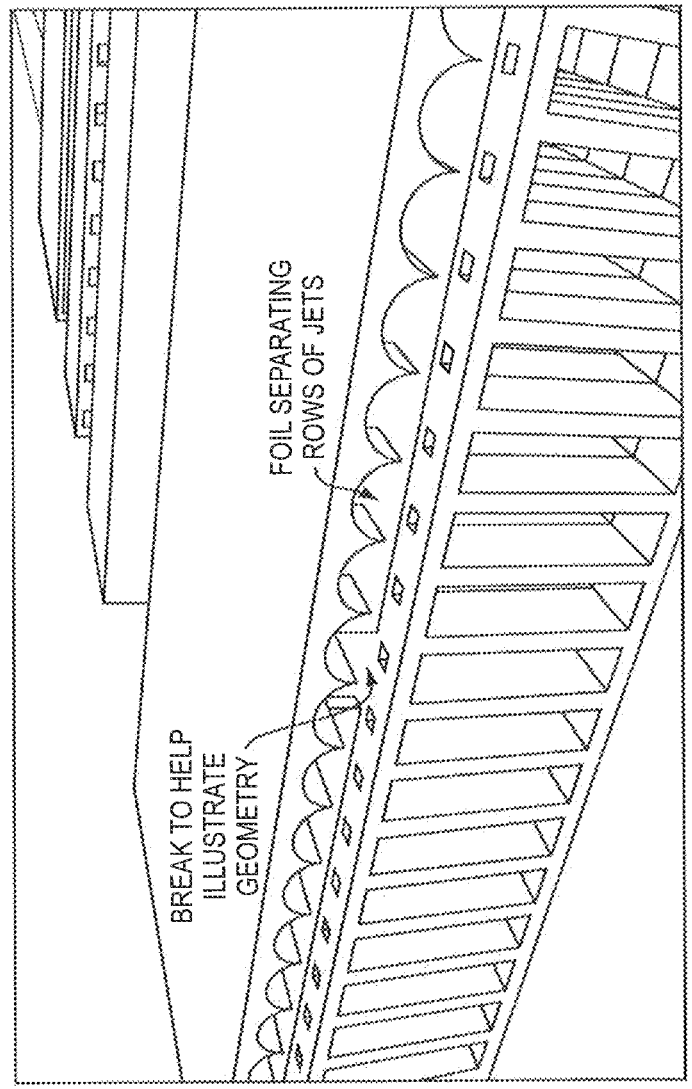
FIG. 2e is a three-dimensional pictorial representation of a further embodiment of a jet impingement cooler of these teachings.

A three dimensional view of one embodiment of the jet impingement of these teachings, other embodiments being also within the scope of these teachings, is shown in FIG. 2e.

In yet another embodiment, the radius of curvature ($r_J$, FIG. 2a) of each of the curved sections of the scalloped surface 15 is selected such that thermal resistance is reduced due to centripetal acceleration, and the formation of vortices and/or turbulent mixing. It should be noted that the radius of curvature can be varied along the curved section, being different at different locations on the scalloped (curved) surface. In one instance, these teachings not being limited only to that instance, the radius of curvature is decreased along the flow direction. In one instance, not a limitation of these teachings, the radius is selected by a criterion indicative of when vortices exist without decaying, such as when $$G = \frac{U_J \theta}{\nu}\left(\frac{\theta}{r_J}\right)^{\frac{1}{2}}$$

is greater than a predetermined quantity, for example, about 0.58 (see, for example, H. Goertler, On the Three-Dimensional Instability of Laminar Boundary Layers on Concave Walls, NACA Technical Memorandum 1375, June 1954, which is incorporated by reference herein in its entirety), where $U_J$ is impinging jet velocity of the Jth jet, $r_J$ is the radius of curvature of the Jth curved section of the scalloped surface (see FIG. 2a), $\nu$ is the kinematic viscosity, $\theta$ is the momentum thickness given by $$\theta = \int_0^\delta \frac{U(z)}{U_J}\left(1 - \frac{U(z)}{U_J}\right)dz$$

where U(z) is the velocity profile in the boundary layer, going from 0 at the surface (z=0) to $U_J$ outside of the boundary layer (z=δ, δ being the boundary layer thickness). It should be noted that other definitions of the thickness of the boundary layer can result in similar criteria but with different numerical bounds (such as $$G' = \frac{U_J \delta}{\nu} \left(\frac{\delta}{r_J}\right)^{\frac{1}{2}}$$

being greater than a predetermined quantity, such as, for example, 16, δ being the boundary layer thickness, see L. Prandtl, Essentials of Fluid Dynamics, Hafner Publishing Company, New York, N.Y., 1952, p. 132 and pp. 106-110, which are incorporated by reference herein in their entirety).

In another instance, the radius of curvature is selected to establish the formation of streamwise vortices (sometimes referred to as Taylor-Görtler vortices or Görtler vortices) according to predetermined (such as measured) conditions (see, for example, H. Umur et al., Current Science, Vol. 87, No. 9, Nov. 10, 2004, 1237-1244, which is incorporated by reference herein in its entirety). The characteristics or the initiation of the vortices (Taylor-Görtler vortices) may be, in one instance, these teachings not being limited to only that instance, controlled via upstream perturbations, such as, but not limited to objects, such as trip-wires, or surface roughness.

While not desiring to be bound by theory, in one explanation, the appearance of vortices does not indicate turbulence of the flow. According to that explanation, turbulence is produced when the Reynolds number is sufficiently large. In that instance, in the boundary layer, the concave surface strengthens turbulent mixing.

Although the above embodiments have been described in general terms, it should be noted that embodiments in which a system of these teachings is integrated on-chip are also within the scope of these teachings. Exemplary embodiments include, but are not limited to, embodiments in which the system of these teachings is fabricated utilizing Micro-ElectroMechanical System (MEMS) technology and embodiments utilizing microfluidic technology.

The areal thermal resistance of an impingement or a convection cooler is related to the resistance of the cooler by the following relation: $\rho th = A\, Rth$, where $\rho th$ is cooler resistivity (K-cm2/W), A is the cooler external surface area receiving heat (cm2) and Rth is the thermal resistance of the cooler (K/W). Cooler thermal resistance is defined as $Rth = (TQW-To)/Q$, where TQW is the characteristic (in one instance, quantum well) temperature for the devices being cooled (K), To is the temperature of the coolant fed to the cooler (K) and Q is the rate at which waste heat is absorbed by the cooler with Q=q A.

Figure 3:
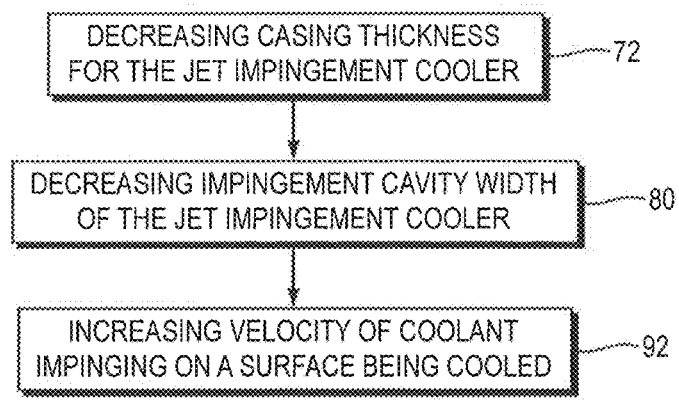
FIG. 3 represents a flowchart of an embodiment of the method of these teachings.

In one embodiment of the method of these teachings, the areal thermal resistance of a jet impingement cooler is reduced to a desired value by decreasing casing thickness of the jet impingement cooler (step 72, FIG. 3), decreasing cavity (chamber) length of the jet impingement cooler (step 80, FIG. 3) and increasing velocity of coolant impinging on the surface being cooled (step 92, FIG. 3).

In one embodiment, the areal thermal resistance of the jet impingement cooler is expressed as a function of the length of the jet impingement cavity (L), the casing thickness (t) and impinging jet velocity (Uj) where FIG. 2a defines the quantities L, Uj and t, and the functional relationship is given below. In this instance, Uj is increased by increasing the flow rate of coolant to the cooler and dj, jet throat width, s, jet cavity height, and w, cross-stream jet cavity width, are taken to be proportional to L. (see FIG. 2c, defining s and w) The functional relations, assuming laminar flow, are:

Areal Thermal Resistance $$\rho th = C_1 \times (t/t_o) + C_2 \times (L/L_o)^{1/2} \times (U_o/U_j)^{1/2} + C_3 \times (U_o/U_j)$$

where
$\rho_{th}$=Thermal areal resistance $Kcm^2/W$
$t_o$, $L_o$, $U_o$ are predetermined values of the appropriate quantities Pressure Drop $$\rho P = C_4 \times (L/L_o) \times (U_j/U_o) \times (A_o/A)$$

where
$\rho P$=Pressure drop, P(outlet)−P(inlet) psid
$L_o$, $U_o$, $A_o$ are predetermined values of the appropriate quantities
$C_1$, $C_2$, $C_3$, and $C_4$ being predetermined constants.
In one instance, these teachings not being limited only to that instance, the predetermined constants are given by
$C_1$=0.0065 $Kcm^2/W$
$C_2$=0.0060 $Kcm^2/W$
$C_3$=0.0115 $Kcm^2/W$
$C_4$=15 psid.

As indicated by the above expression, the thermal resistance decreases linearly with decreasing casing thickness "t." The thermal resistance also decreases as the square root of jet impingement cavity length "L" and inversely with jet impingement velocity Uj. Thus, the areal thermal resistance relation of these teachings provides a systematic method for reducing the thermal resistance of jet impingement coolers.

The pressure drop as the coolant flows through the jet impingement cavity scales linearly with both jet impingement cavity length "L" and velocity "Uj," It also scales inversely with jet cavity cross-sectional area "A," where "A" is proportional to the product of cross-steam depth "w" and let cavity height "s" (see FIG. 2c). Thus, the pressure drop expression provides a systematic method for defining jet impingement cooler characteristics that also yield low pressure drop, these devices being feasible to implement in practice.

Figure 4:
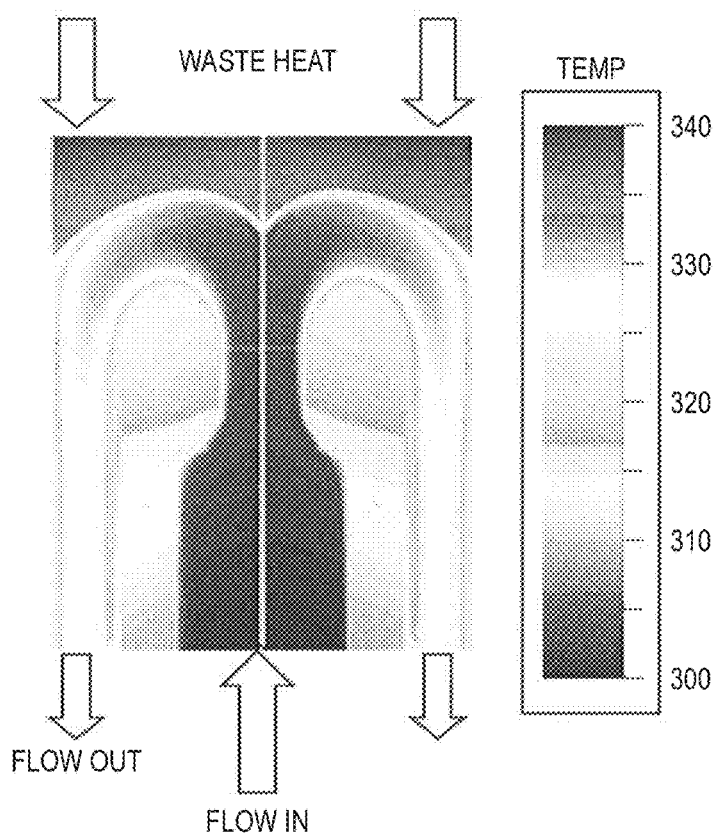
FIG. 4 is a graphical schematic representation of results of an FEM (Finite Element. Model) calculation for an embodiment of the system of these teachings.
Figure 5:
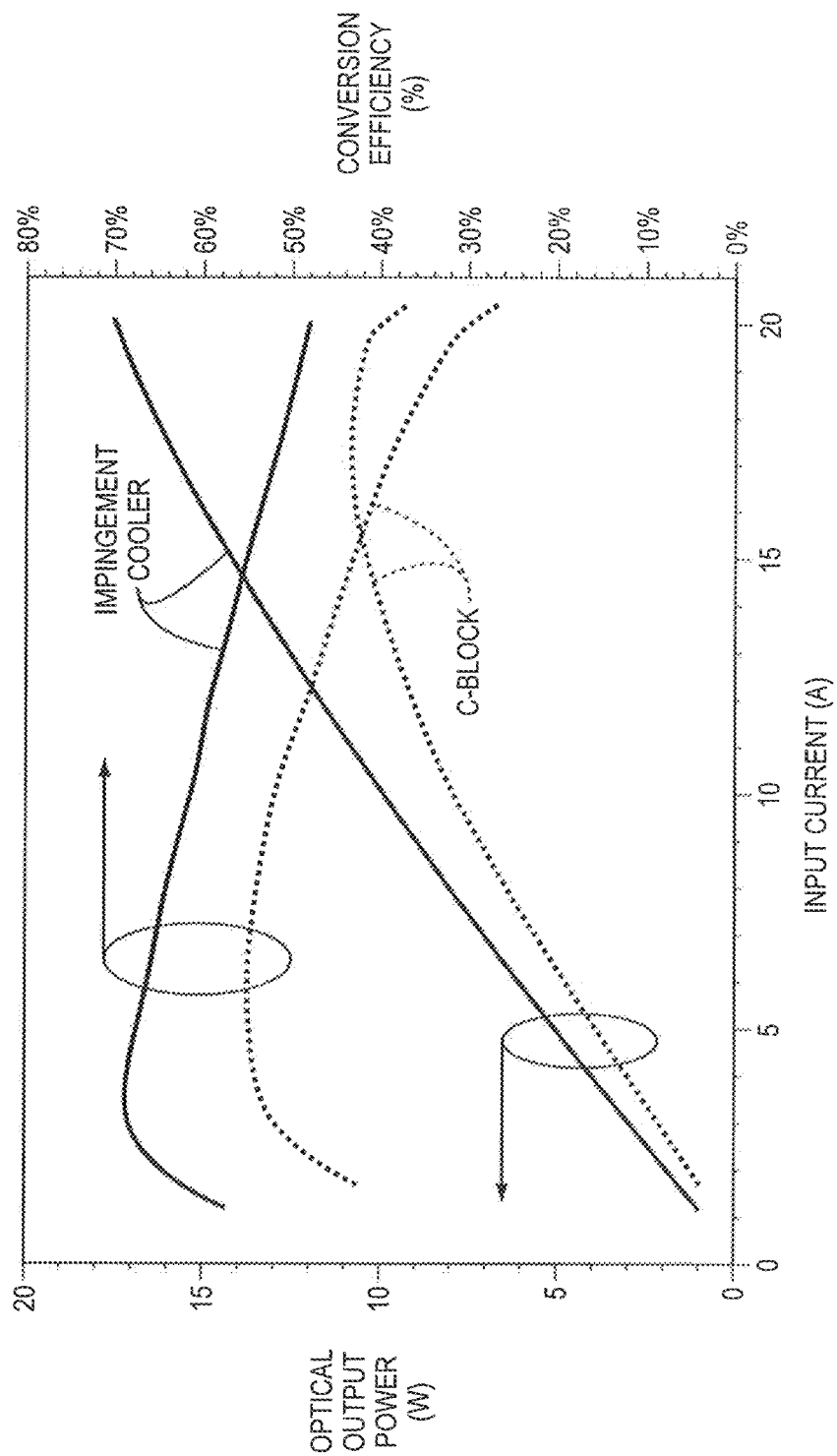
FIG. 5 is a graphical schematic representation of measured results for laser diodes cooled with an embodiment of the system of these teachings.

FIG. 4 shows a graphical representation of the results of finite element analysis (FEM) of an embodiment of a system design according to the method of these teachings. FIG. 5 shows results for laser diodes utilizing an impingement cooler designed according to the method of these teachings. As can be seen from FIG. 5, a conversion efficiency of about 70% and higher optical output are obtained utilizing the impingement cooler of these teachings.

Figure 6A:
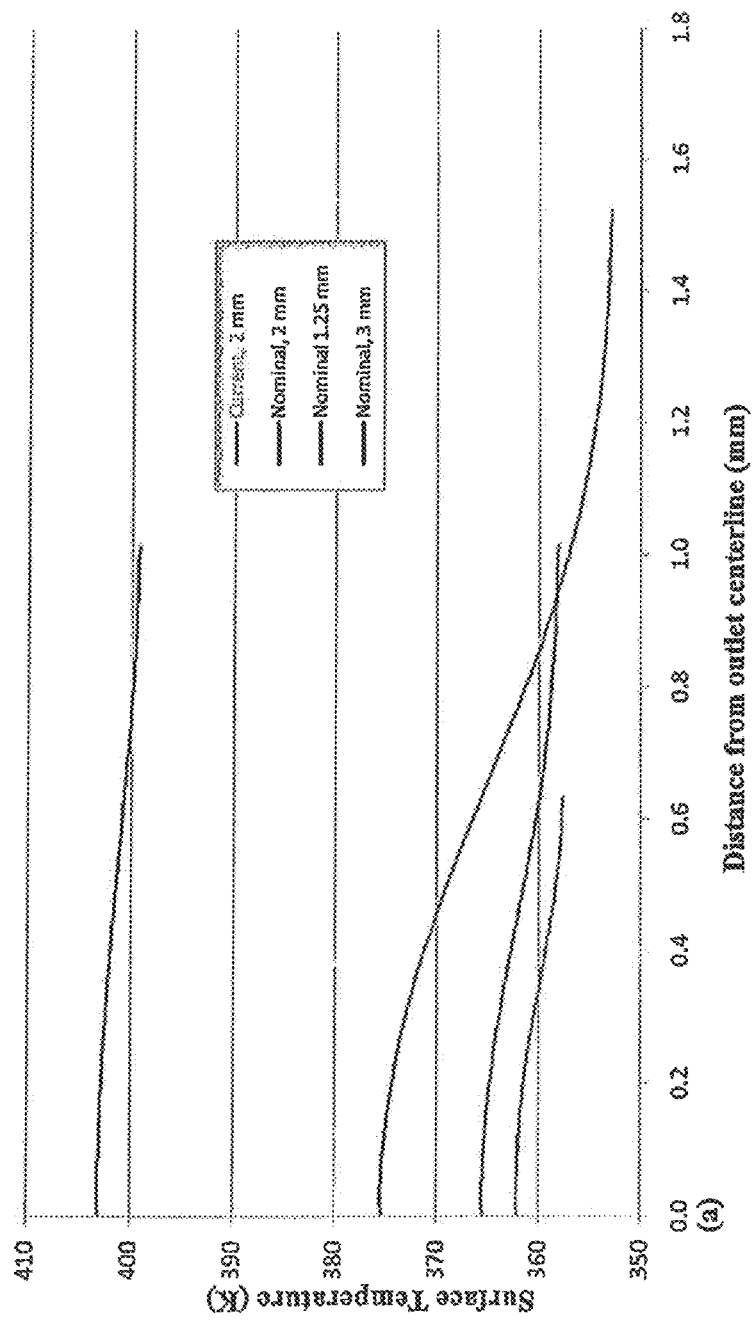
FIGS. 6a and 6b depict results of calculations of surface temperature of a surface cooled utilizing an embodiment of the system of these teachings.
Figure 6B:
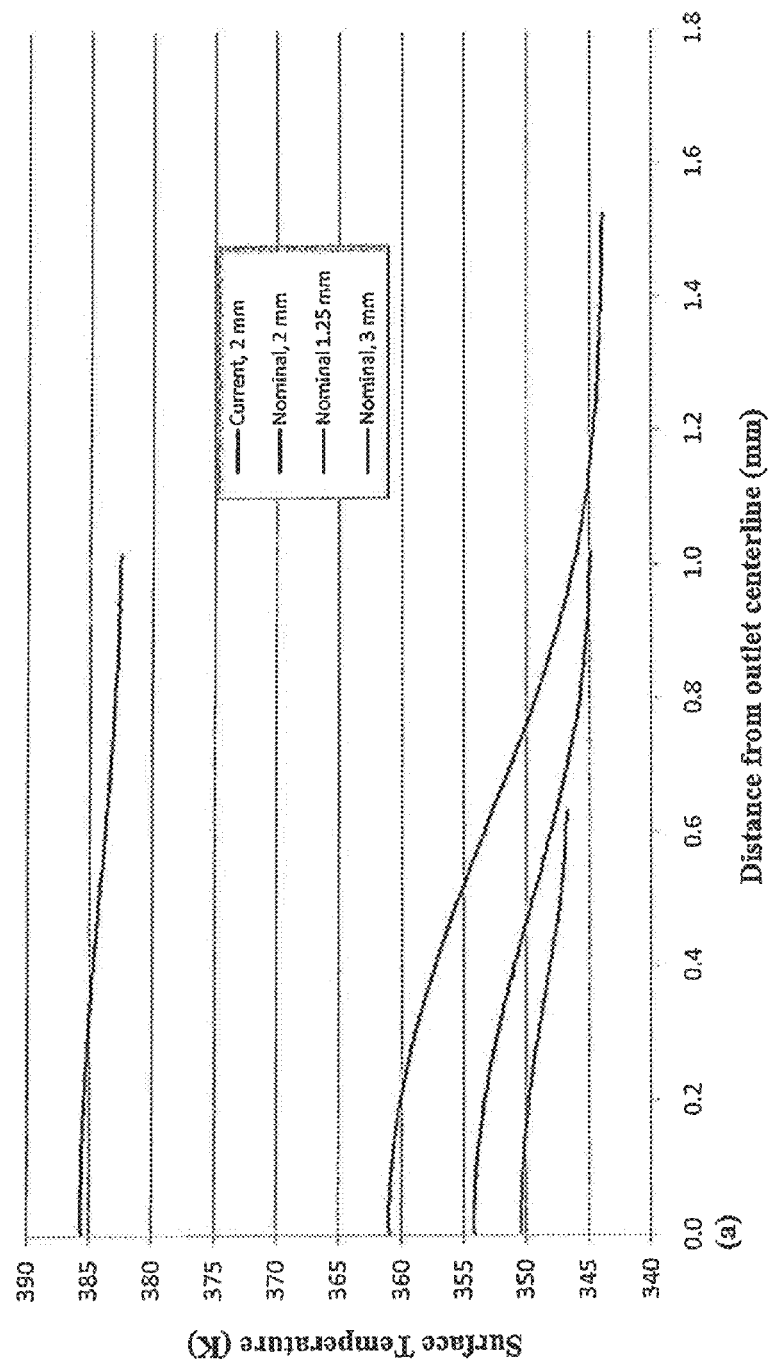

FIGS. 6a and 6b depict results of calculations of surface temperature of a surface cooled utilizing an embodiment of the system of these teachings. The results shown in FIG. 6a illustrate the special variation of surface temperature for several values of the "gull wing length," "L" in FIG. 2c, and for a coolant flow rate of about 1.25 lpm per $cm^2$ of heat extraction area. The results shown in FIG. 6b illustrate the special variation of surface temperature for several values of the "gull wing length," "L" in FIG. 2c, and for a coolant flow rate of about 2.5 lpm per $cm^2$ of heat extraction area. The temperature profiles in FIGS. 6a-6b span from point "a" corresponding to 0 mm and being at the center of an outlet port to point "b" directly above the center of an inlet jet and located a distance of L/2 (see FIG. 2c) from point "a." Table 1 gives the jet impingement cavity characteristic dimensions for the surface temperature profiles given in FIGS. 6a and 6b.

Although the following properties are exhibited by various embodiments and are not limited to the embodiments of FIGS. 6a and 6b, some of those properties are illustrated by the results shown in FIGS. 6a and 6b.

Reducing the width (L) of the gull wing shaped impingement surface reduces the magnitude of the spatial variation in surface temperature, i.e., produces a more uniform surface temperature.

Lining up laser diode emitting stripes with minimums in surface temperature will provide lowest thermal resistance, thereby yielding maximum laser diode efficiency and/or maximum optical output power.

Although casing thickness (t) and cavity height (s) were changed simultaneously, reducing these dimensions significantly reduce laser diode temperature, which is indicative of significant reductions in thermal resistance.

A comparison of FIG. 6a and FIG. 6b, wherein the temperature profiles in FIG. 6a are for a coolant flow rate of 1.25 lpm/cm$^2$ versus 2.5 lpm/cm$^2$ for FIG. 6b, shows that increasing coolant flow rate significantly reduces heat extraction surface temperature, which is indicative of significant reductions in thermal resistance. The reductions in thermal resistance are quantified in Table 2.

A comparison of the results in Table 2 for let impingement cavity pressure clearly shows that pressure drop decreases with decreasing jet impingement cavity length (L). This trend is desirable in that lower pressure losses reduce pump requirements or allow higher flow rates when keeping pressure loss requirements constant. The first benefit reduces system cost. The latter benefit allows high coolant flow rates, which decreases cooler thermal resistance.

These modifications also allow for the fabrication of thinner coolers that may be utilized with present and future electronic and photonic systems.

TABLE 1

Characteristic jet impingement cavity dimensions associated with the surface temperature profiles presented in FIG. 1. Microchannel Thermal Trades Analysis Matrix

|  | t (μm) | s (μm) | d (μm) | L (mm) | w (μm) | Foil Thickness (μm) |
|---|---|---|---|---|---|---|
| Current | 250 | 632.5 | 400 | 2 | 25 | 50 |
| Nominal | 125 | 316.25 | 400 | 2 | 25 | 50 |
| Nominal, 1.25 mm | 125 | 316.25 | 250 | 1.25 | 25 | 50 |
| Nominal, 3 mm | 125 | 316.25 | 600 | 3 | 25 | 50 |

TABLE 2

Variation of thermal resistance, mean surface temperature and pressure drop for the devices having the characteristic jet impingement cavity dimensions presented in Table 1.

|  | Flow Rate (L/min/cm$^2$) | Ave. Surface Temp. (K) | Peak Velocity (m/s) | ΔP (kPa) | Thermal Resistance |
|---|---|---|---|---|---|
| Current, 2 mm | 1.25 | 401.3 | 3.8 | 27.7 | 0.04052 |
|  | 2.5 | 384.2 | 6.24 | 61.1 | 0.03368 |
| Nominal, 2 mm | 1.25 | 361.6 | 3.1 | 30.5 | 0.02464 |
|  | 2.5 | 349.45 | 6.25 | 65.4 | 0.01978 |
| Nominal, 1.25 mm | 1.25 | 360.1 | 3.1 | 23 | 0.02404 |
|  | 2.5 | 348.7 | 6.04 | 52.9 | 0.01948 |
| Nominal, 3 mm | 1.25 | 363.3 | 3.54 | 47.6 | 0.02532 |
|  | 2.5 | 351.3 | 6.73 | 105 | 0.02052 |

Figures 7A, 7B:
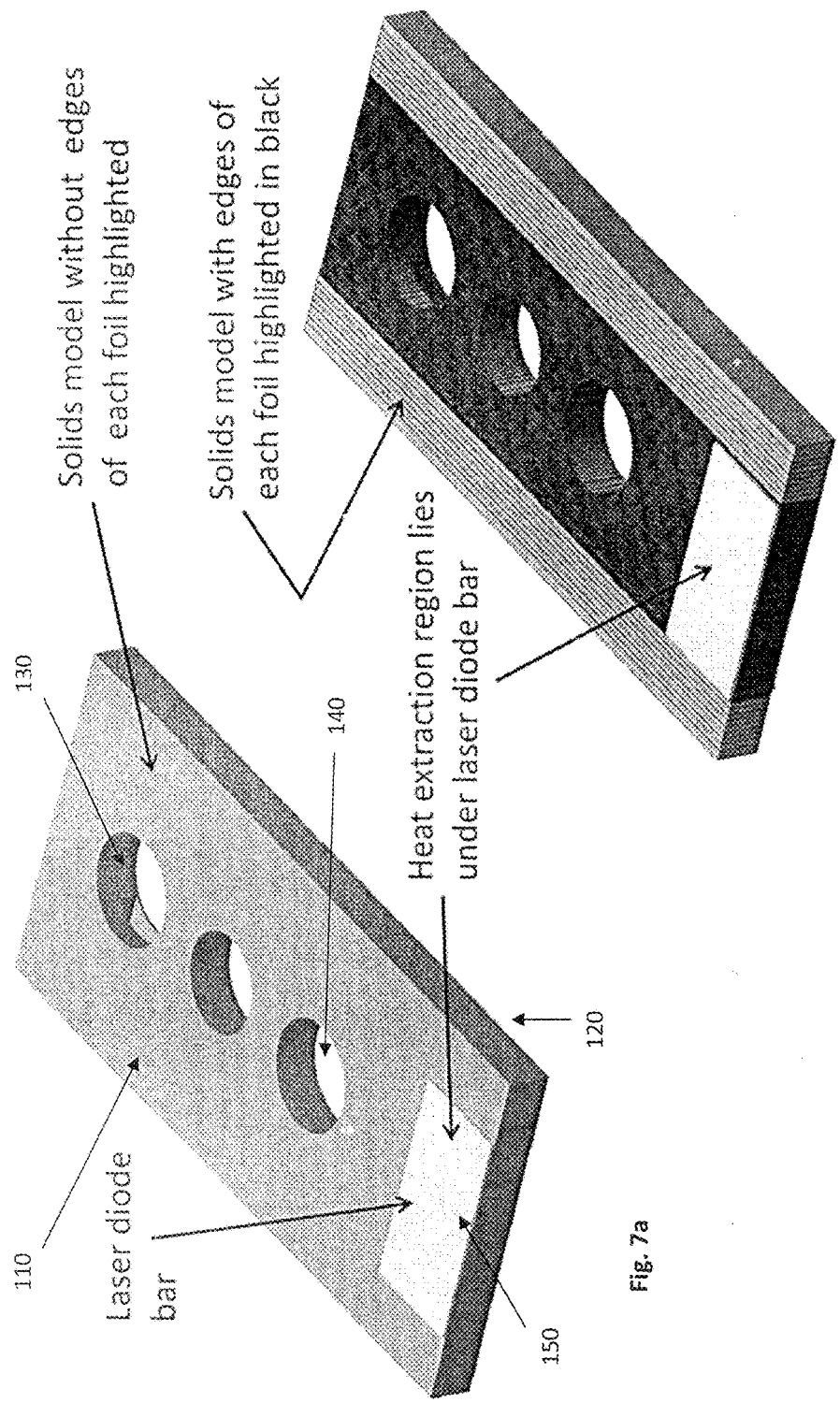
FIGS. 7a and 7b show a heat flux removal module assembly of these teachings.
Figure 9A:
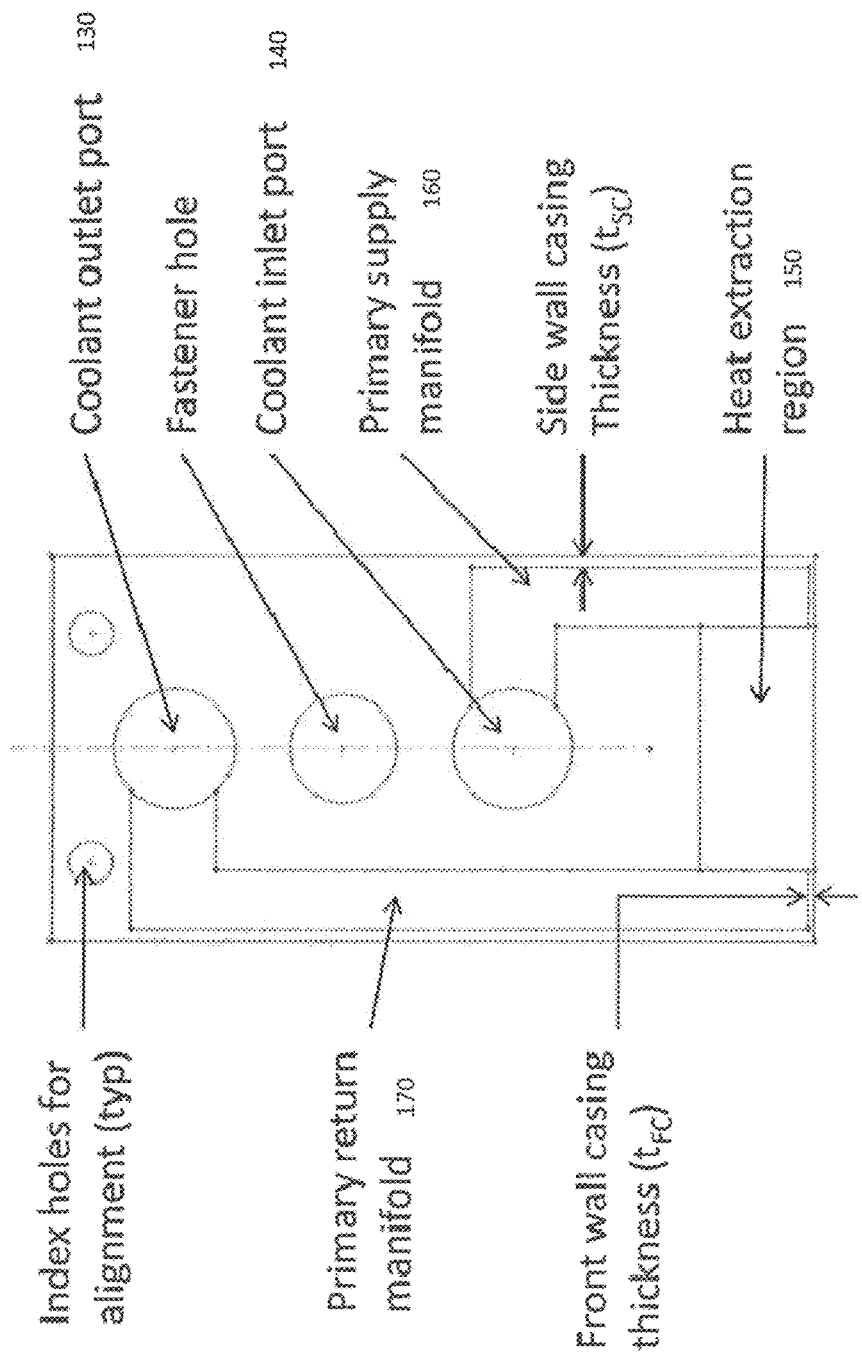
FIGS. 9a, 9b show another cross-section of the heat flux removal module of these teachings.
Figure 9B:
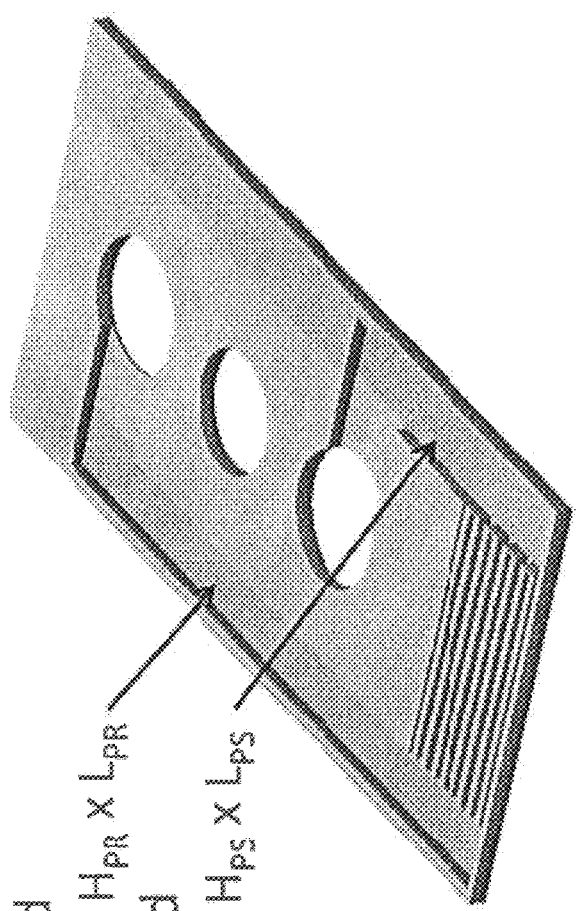
Figure 10:
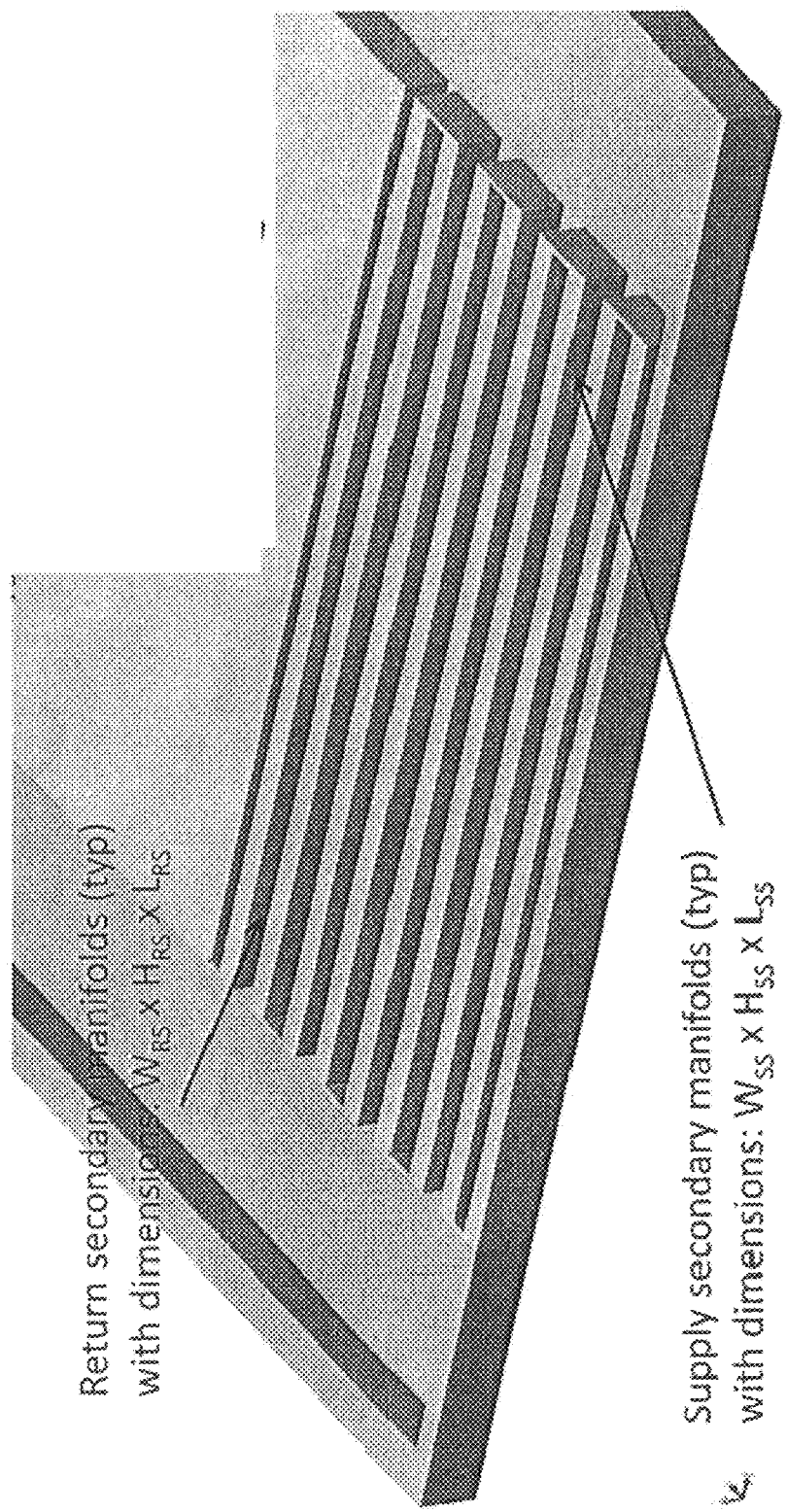
FIG. 10 shows still another cross-section of the heat flux removal module of these teachings.

FIGS. 7a and 7b show a heat flux removal module assembly of these teachings and FIGS. 8a and 8b, 9 and 9b show two different cross-sections of the heat flux removal module of these teachings. Referring to FIGS. 7a-9b, in the embodiment shown therein the heat flux removal module assembly has a first surface 110 and the second surface 120 disposed substantially parallel to the first surface. The laser diode bar is disposed on the first surface. (it should be noted that these teachings apply to other electronic components and the use of the term "laser diode" herein should be taken to mean a generic electronic component for which cooling is desired, unless the context indicates otherwise.) Three cavities, a coolant inlet port 140, a fastener hole and a coolant outlet port 130, provide access from the second surface to the first surface for fluid inlet, fluid outlet and fastening respectively. A primary supply manifold 160 operatively connects, for flow transmission, the coolant inlet port to a heat flux removal component disposed under the laser diode. A portion of the primary supply manifold 160 is disposed between one edge of the laser diode and one edge of the first surface, that portion of the primary supply manifold being disposed along the edge of the first surface. The primary supply manifold is operatively connected to secondary supply manifolds for the heat removal component disposed under to the laser diode (see FIG. 8a). In one instance, the secondary supply manifolds are the coolant supply chambers 20 of a jet impingement cooler.

A primary return manifold 170 operatively connects, for flow transmission, the coolant outlet port 130 to the heat flux removal component disposed under the laser diode. A portion of the primary return manifold is disposed between another edge of the laser diode and another edge of the first surface, that portion of the primary return manifold being disposed along the other edge of the first surface. The primary return manifold is operatively connected to secondary return manifolds for the heat removal component disposed under the laser diode (see FIG. 8a). In one instance, the secondary return manifolds are the coolant return chambers 60 of the jet impingement cooler.

Placing the primary return manifolds between the edges of the laser diode and the edges of the first surface enables reducing the height (H, FIG. 8a) of the heat flux removal module assembly of these teachings. Applying the present teachings, heat flux removal module assemblies with a height of less than 3.0 mm, about 2.3 mm in one instance, can be obtained. The thinner heat flux removal module assemblies of these teachings result in higher brightness laser diode arrays.

Figures 11A, 11B:
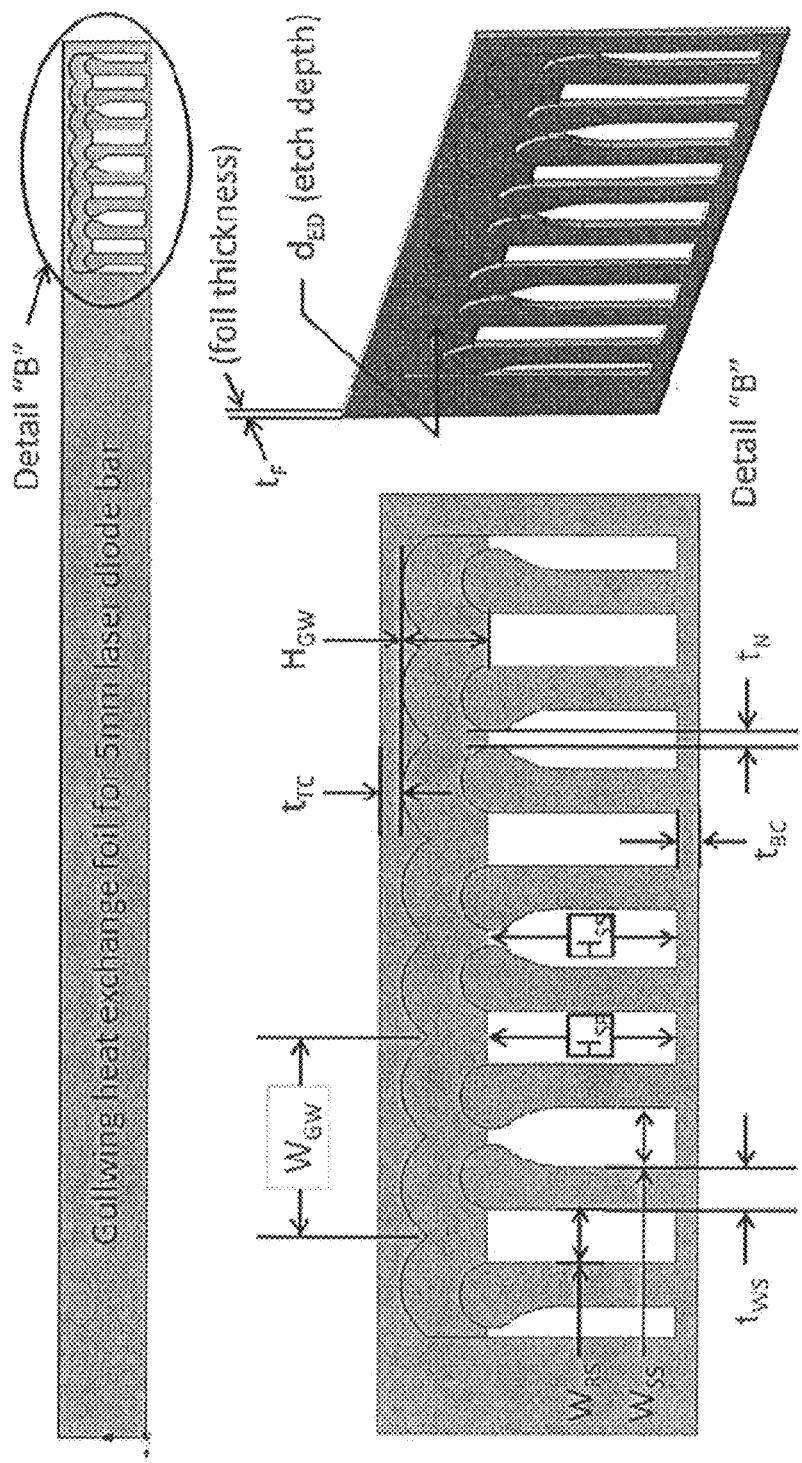
FIGS. 11a, 11b show yet another cross-section of the heat flux removal module of these teachings.
Figure 11C:
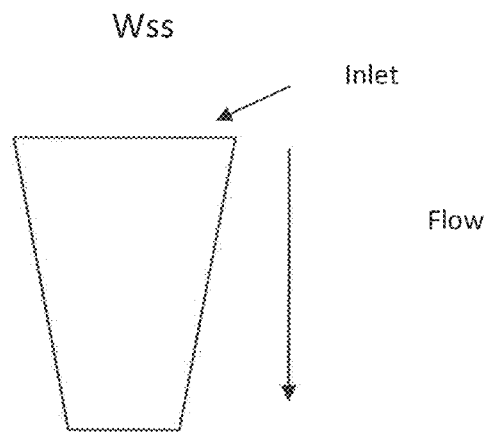
FIGS. 11c, 11d show the variation along the flow direction of the width the secondary source manifold and the secondary return manifold.
Figure 11D:
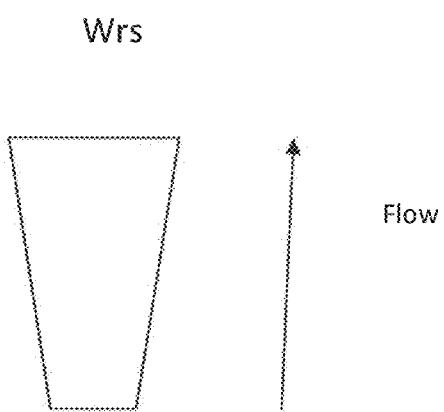

FIGS. 11a and 11b provide details of the dimensions for the jet impingement cooler of these teachings and the secondary return manifolds of these teachings. An exemplary embodiment of these teachings is presented in the Appendix, although it should be noted that these teachings are not limited only to the exemplary embodiment. In order to maintain substantially uniform cooling for the laser diode, or any other electronic component, in one embodiment, the width of the secondary supply manifold (Wss, FIG. 11a) is varied along the direction of flow, being wider at the inlet. Similarly, in one embodiment the width of the secondary outlet manifold ($W_{RS}$, FIG. 11a) is varied along the direction of flow, being narrower at the outlet. In one instance, the widths are given by:

$$WSR(X)=WS0(X/LSR)$$

$$WSS(X)=WS0(1-X/LSS)$$

Where X is the distance into the jet impingement cooler assembly and LSS=LSR is the Length in flow direction of secondary supply and return manifolds.

It should be noted that other relationships may be used in other embodiments and are within the scope of these teachings.

In one embodiment, the laser diode stack of these teachings includes a number of assemblies, each one assembly being an assembly such as shown in FIGS. 7A-9 and including a cooler assembly having a first surface, a second surface disposed away from the first surface, a number of openings extending from the first surface to the second surface, one opening from the number of openings being a coolant outlet port, another opening from the number of openings being a coolant inlet port, a region proximate to a first end comprising a heat extraction component, the region disposed to receive an electronic component on the first surface, a laser diode component disposed on that region, a first and second sides extending from the first end to a second end, a supply manifold operatively connecting the coolant inlet port to a number of supply openings in the heat extraction component, a portion of the supply manifold extending along a portion of the first side, a return manifold operatively connecting the coolant outlet port to a number of return openings in the heat extraction component, a depth of the supply manifold and the return manifold extending from the first surface towards the second surface. A first assembly is disposed on a collection/source component 187 (FIG. 12B) and operatively connected to the collection/source component 187 so that a fluid can flow between the first assembly and the collection/source component 187. Another collection/source component 185 (FIG. 12B) is disposed on a last assembly and operatively connected to the other collection/source component 185 so that a fluid can flow between the last assembly and the other collection/source component 185. The operative connection is made by means of a number of connection components. The coolant outlet port of each one assembly is operatively connected to the coolant outlet port of the assembly located below and the coolant inlet port of each one assembly is operatively connected to the coolant inlet port of the assembly located below, the operative connection being made by means of connection components (such as, but not limited to, O-rings). Only one source of coolant is used and only one collection system for coolant is necessary. In one instance, at least one connection component is a gasket having a substantially rectangular cross section.

Figure 12A:
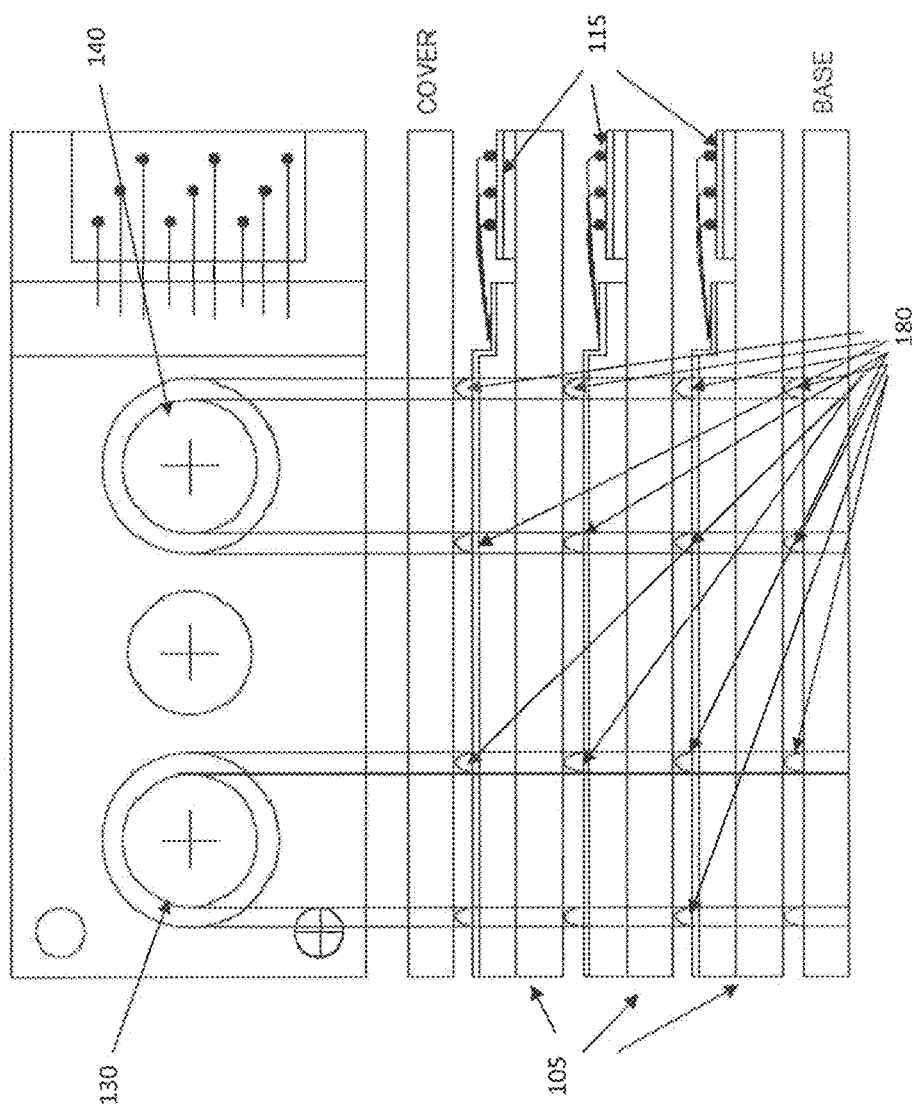
FIG. 12a shows a stack of heat flux removal module assemblies with laser diodes attached.
Figure 12B:
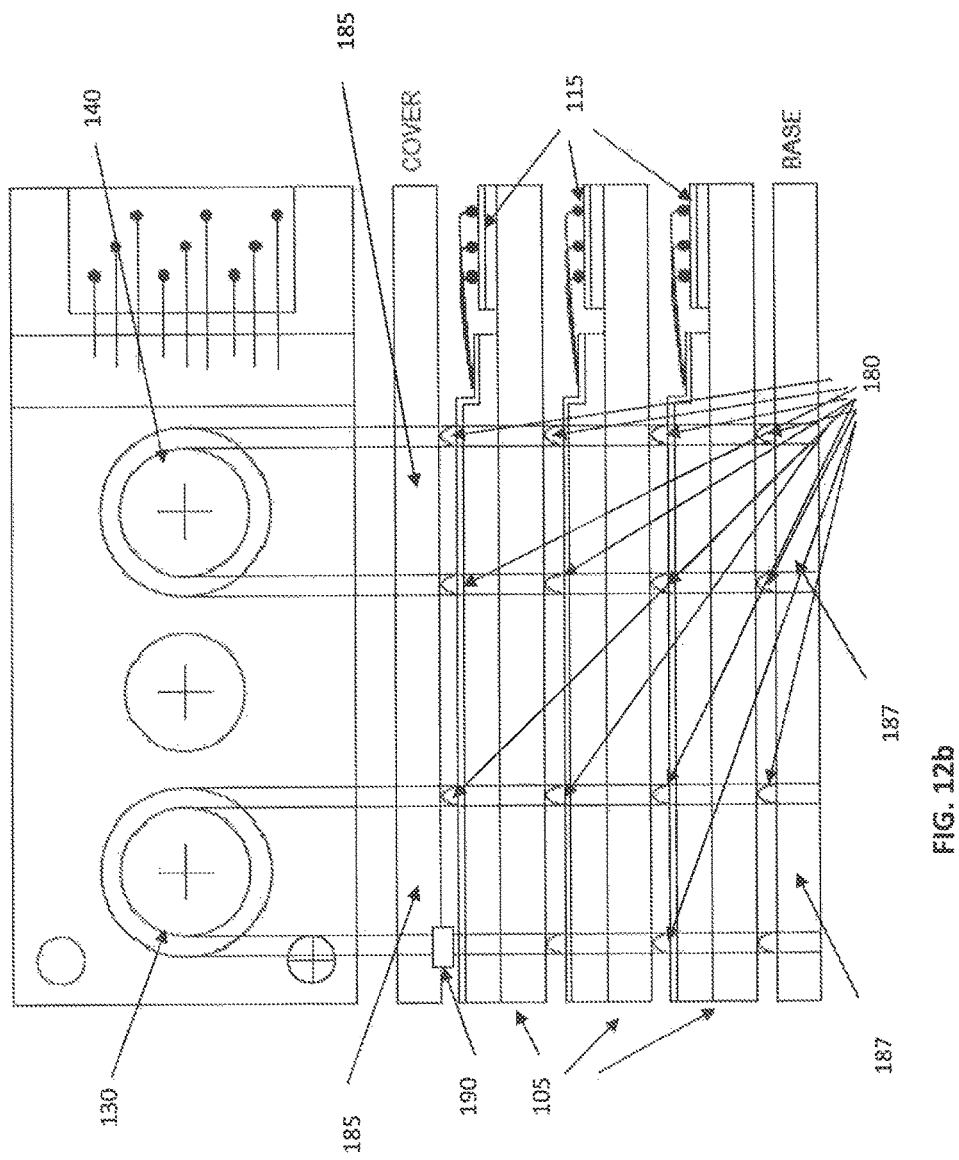
FIG. 12b shows a stack of heat flux removal module assemblies with laser diodes attached where one O-ring in the assemblies is replaced with a hollow cylindrical gasket.

FIG. 12a shows an embodiment in which the heat flux removal module assemblies 105, with the laser diodes 115 included, are assembled into a stack, the coolant outlet ports 130 and the coolant inlet ports 140 being operatively connected (by connection components 180) so that only one source of coolant is used and only one collection system for coolant is necessary. In the embodiment shown in FIG. 12a, O-rings are used, as connection components, to seal the operative connection between one coolant inlet port and another coolant inlet port and between one coolant outlet port and another coolant outlet port. It has been shown that use of O-rings may result in corrosion. FIG. 12b shows another embodiment of the stack of these teachings in which at least one O-ring is replaced by a gasket 190 having a substantially rectangular cross-section, as shown in FIGS. 12c and 12d.

Figure 12C:
FIGS. 12c and 12d show the hollow cylindrical gasket and the rectangular cross-section of the hollow cylindrical gasket.
Figure 12D:

The material of the gasket, shown in FIGS. 12c and 12d can be any material used for O-rings, for example, an elastomer such as Nitrile (Buna-N), Flourocarbon (Viton®), Silicone, EPUM, PTFE, Perflouroelastomers (Kalrez®, Simriz®, Chemraz®), Neoprene, PTFE Encapsulated Viton & Silicone, Aflas®, and Polyurethane, or any other rubber used for O-rings.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A cooler assembly comprising:
    a first surface on which an electronic component is disposed;
    a second surface disposed away from the first surface;
    a number of openings extending from the first surface to the second surface; one opening from the number of openings being a coolant outlet port; another opening from the number of openings being a coolant inlet port;
    a region proximate to a first end comprising a heat extraction component; said region disposed to receive an electronic component on the first surface;
    a first and second sides extending from the first end to a second end;
    a primary supply manifold operatively connecting the coolant inlet port to a number of supply openings in the heat extraction component; a first portion of the primary supply manifold extending along a portion of the first side and disposed between one edge of the electronic component and an edge of the first side; a second portion of the primary supply manifold extending from the coolant inlet port, supplying coolant up to the first surface, to the first portion; and
    a primary return manifold operatively connecting the coolant outlet port to a number of return openings in the heat extraction component; a first portion of the primary return manifold extending along a portion of the second side and disposed between another edge of the electronic component and an edge of the second side; a second portion of the primary return manifold extending from the first portion of the primary return manifold to the coolant outlet port, which supplies coolant down from the first surface;
    a depth of the primary supply manifold and the primary return manifold extending from a surface coincident with the first surface and towards the second surface;

the depth of the primary supply manifold and the depth of the primary return manifold being less than a distance between the first surface and the second surface.

2. The cooler assembly of claim 1 wherein the heat extraction component comprises:
   a number of pairs of openings, each pair comprising a supply opening and a return opening; each one supply opening being operatively disposed to provide fluid to an impingement section; each one return opening being operatively disposed to receive fluid from an impingement section; supply opening being comprised in secondary supply manifolds; return openings being comprised in secondary return manifolds;
   said impingement section comprising:
      a third surface from which fluid is provided from the supply opening and to which fluid is returned to the return opening;
      a fourth surface opposite said third surface; said fourth surface having a number of curved sections; each one curved section being concave towards an impinging flow direction of the fluid provided from one supply opening from one pair of openings; said each one curved section and said one pair of openings being operatively disposed such that there is substantially no stagnation point in flow along said each one curved section; and
      a fifth surface opposite said fourth surface and thermally operatively connected to said fourth surface; said fifth surface disposed to receive the electronic component.

3. The cooler assembly of claim 2 wherein a radius of curvature of each one curved section is varied along said each one curved section.

4. The cooler assembly of claim 3 wherein the radius of curvature is decreased along a flow direction.

5. The cooler assembly of claim 2 wherein a distance between said first surface and said second surface is less than 3 mm.

6. The cooler assembly of claim 2 wherein each supply opening and each return opening has a first characteristic dimension, referred to as height, measuring a distance between the second surface and the first surface, and a second characteristic dimension, referred to as with, measuring a distance substantially perpendicular to the first characteristic dimension; wherein a width of said each one supply opening varies along a direction of flow, decreasing in the flow direction; and where a width of said each one return opening varies along the direction of flow, increasing in the flow direction.

7. The cooler assembly of claim 1 wherein a distance between said first surface and said second surface is less than 3 mm.

8. A laser diode stack comprising:
   a number of assemblies, each one assembly comprising:
      a first surface on which a laser diode bar is disposed;
      a second surface disposed away from to the first surface;
      a number of openings extending from the first surface to the second surface; one opening from the number of openings being a coolant outlet port; another opening from the number of openings being a coolant inlet port;
      a region proximate to a first end comprising a heat extraction component; said region disposed to receive an electronic component on the first surface;
      a laser diode component disposed on said region; the laser diode component being the electronic component;
      a first and second sides extending from the first end to a second end;
      a primary supply manifold operatively connecting the coolant inlet port to a number of supply openings in the heat extraction component; a first portion of the primary supply manifold extending along a portion of the first side and disposed between one edge of the electronic component and an edge of the first side; a second portion of the primary supply manifold extending from the coolant inlet port, supplying coolant up to the first surface; to the first portion; and
      a primary return manifold operatively connecting the coolant outlet port to a number of return openings in the heat extraction component; a first portion of the primary return manifold extending along a portion of the second site and disposed between another edge of the electronic component and an edge of the second side;
      a second portion of the primary return manifold extending from the first portion of the primary return manifold to the coolant outlet port, which supplies coolant down from the first surface;
      a depth of the primary supply manifold and the primary return manifold extending from a surface coincident with the first surface and towards the second surface; the depth of the primary supply manifold and the depth of the primary return manifold being less than a distance between the first surface and the second surface;
   a first assembly being configured to be flow operatively connected to a collection/source component;
   each assembly from the number of assemblies, except the first assembly, being disposed on and flow operatively connected on another assembly from the number of assemblies;
   on a last assembly;
   a number of connection components; the coolant outlet port of one assembly being flow operatively connected to the coolant outlet port of another assembly by means of one connection component from the number of connection components; said another assembly being disposed on said one assembly; the coolant inlet port of said one assembly being flow operatively connected to the coolant outlet port of said another assembly by means of another connection component from the number of connection components;
   the coolant inlet port of said first assembly and the coolant outlet port of said first assembly being flow operatively connected, by means of a first and second connection components from said number of connection components, and configured such that only one source is used;
   the coolant inlet port of said last assembly and the coolant outlet port of said last assembly being flow operatively connected, by means of a next-to-last connection component and a last connection component, and configured such that only one collection system is used.

9. The laser diode stack of claim 8 wherein the heat extraction component comprises:
   a number of pairs of openings, each pair comprising a supply opening and a return opening; each one supply opening being operatively disposed to provide fluid to an impingement section; each one return opening being operatively disposed to receive fluid from an impingement section; supply opening being comprised in secondary supply manifolds; return openings being, comprised in secondary return manifolds;

said impingement section comprising:
- a third surface from which fluid is provided from the supply opening and to which fluid is returned to the return opening;
- a fourth surface opposite said third surface; said fourth surface having a number of curved sections; each one curved section being concave towards an impinging flow direction of the fluid provided from one supply opening from one pair of openings; said each one curved section and said one pair of openings being operatively disposed such that there is substantially no stagnation point in flow along said each one curved section; and
- a fifth surface opposite said fourth surface and thermally operatively connected to said fourth surface; said fifth surface disposed to receive the electronic component.

10. The laser diode stack of claim 9 wherein a radius of curvature of each one curved section is varied along said each one curved section.

11. The laser diode stack of claim 10 wherein the radius of curvature is decreased along a flow direction.

12. The laser diode stack of claim 11, wherein a distance between said first surface and said second surface is less than 3 mm.

13. The laser diode stack of claim 9 wherein each supply opening and each return opening has a first characteristic dimension, referred to as height, measuring a distance between the second surface and the first surface, and a second characteristic dimension, referred to as width, measuring a distance substantially perpendicular to the first characteristic dimension; wherein a width of said each one supply opening varies along, a direction of flow, decreasing in the flow direction and where a width of said each one return opening varies along the direction of flow, increasing in the flow direction.

14. The laser diode stack of claim 8 wherein a distance between said first surface and said second surface is less than 3 mm; wherein a higher brightness laser diode array can be assembled.

15. The laser diode stack of claim 8 wherein at least one connection component from the number of connection components being a gasket having a substantially rectangular cross section.

16. The laser diode stack of claim 15 wherein the gasket comprises an elastomer material.

17. A method for assembling a higher brightness laser diode array, the method comprising:
   assembling a laser diode stack from a number of sub-assemblies, each one sub-assembly comprising:
   - a first surface on which a laser diode bar is disposed;
   - a second surface disposed away from to the first surface;
   - a number of openings extending from the first surface to the second surface; one opening from the number of openings being a coolant outlet port; another opening from the number of openings being a coolant inlet port;
   - a region proximate to first end comprising a heat extraction component said region disposed to receive an electronic component on the first surface;
   - a laser diode component disposed on said region; the laser diode component being the electronic component;
   - a first and second sides extending from the first end to a second end;
   - a primary supply manifold operatively connecting the coolant inlet port to a number of supply openings in the heat extraction component; a first portion of the primary supply manifold extending along a portion of the first side and disposed between one edge of the electronic component and an edge of the first side; a second portion of the primary supply manifold extending from the coolant inlet port, supplying coolant up to the first surface, to the first portion; and
   - a primary return manifold operatively connecting the coolant outlet port to a number of return openings in the heat extraction component; a first portion of the primary return manifold extending along a portion of the second site and disposed between another edge of the electronic component and an edge of the second side;
   - a second portion of the primary return manifold extending from the first portion of the primary return manifold to the coolant outlet port, which supplies coolant down from the first surface;
   - a depth of the primary supply manifold and the primary return manifold extending from a surface coincident with the first surface and towards the second surface; the depth of the primary supply manifold and the depth of the primary return manifold being less than a distance between the first surface and the second surface;
   each subassembly being flow operatively connected to at least one other subassembly such that only one source of coolant is used and only one collection system for coolant is used;
   the number of sub-assemblies enabling use of a thinner heat extraction component, resulting in a higher brightness laser diode array.

18. The method of claim 17 wherein the heat extraction component comprises:
   a number of pairs of openings, each pair comprising a supply opening and a return opening; each one supply opening being operatively disposed to provide fluid to an impingement section; each one return opening being operatively disposed to receive fluid from an impingement section; supply opening being comprised in secondary supply manifolds; return openings being comprised in secondary return manifolds;

said impingement section comprising:
   - a third surface from which fluid is provided from the supply opening and to which fluid is returned to the return opening;
   - a fourth surface opposite said third surface; said fourth surface having a number of curved sections; each one curved section being concave towards an impinging flow direction of the fluid provided from one supply opening from one pair of openings; said each one curved section and said one pair of openings being operatively disposed such that there is substantially no stagnation point in flow along said each one curved section; and
   - a fifth surface opposite said fourth surface and thermally operatively connected to said fourth surface; said fifth surface disposed to receive the electronic component.

* * * * *

UNITED STATES PATENT AND TRADEMARK OFFICE
CERTIFICATE OF CORRECTION

PATENT NO. : 10,270,220 B1
APPLICATION NO. : 14/206607
DATED : April 23, 2019
INVENTOR(S) : Henry M. Eppich et al.

Page 1 of 1

It is certified that error appears in the above-identified patent and that said Letters Patent is hereby corrected as shown below:

In the Claims

In Column 13, Line 45 (Claim 6), "referred to as with," should read -- referred to as width --

In Column 15, Lines 1-2 (Claim 9), "return openings being, comprised" should read -- return openings being comprised --

In Column 15, Line 35 (Claim 13), "varies along, a direction of flow" should read -- varies along a direction of flow --

In Column 15, Line 36 (Claim 13), "in the flow direction and where a width" should read -- in the flow direction; and where a width --

In Column 15, Lines 61-62 (Claim 17), "a heat extraction component said region" should read -- a heat extraction component; said region --

Signed and Sealed this
Sixth Day of August, 2019

Andrei Iancu
*Director of the United States Patent and Trademark Office*